United States Patent
Qiao et al.

(10) Patent No.: US 8,088,650 B2
(45) Date of Patent: Jan. 3, 2012

(54) METHOD OF FABRICATING CHIP PACKAGE

(75) Inventors: Yong-Chao Qiao, Shanghai (CN);
Jie-Hung Chiou, Shanghai (CN);
Yan-Yi Wu, Shanghai (CN)

(73) Assignee: ChipMOS Technologies (Bermuda) Ltd., Hamilton (BM)

( * ) Notice: Subject to any disclaimer, the term of this patent is extended or adjusted under 35 U.S.C. 154(b) by 277 days.

(21) Appl. No.: 12/506,245

(22) Filed: Jul. 20, 2009

(65) Prior Publication Data

US 2009/0280603 A1 Nov. 12, 2009

Related U.S. Application Data

(62) Division of application No. 11/737,766, filed on Apr. 20, 2007, now abandoned.

(30) Foreign Application Priority Data

Mar. 13, 2007 (CN) .......................... 2007 1 0087671

(51) Int. Cl.
*H01L 21/00* (2006.01)

(52) U.S. Cl. ........ 438/123; 438/106; 438/111; 438/112; 438/113; 438/118; 438/124; 438/127; 257/666; 257/734; 257/779; 257/781; 257/784; 257/787; 257/789; 257/E23.031; 257/E23.037; 257/E23.05; 257/E23.079; 257/E23.116; 257/E23.128; 257/E21.499

(58) Field of Classification Search .................. 257/666, 257/734, 779, 781, 784, 786, 787, 789, E23.031, 257/E23.037, E23.05, E23.079, E23.116, 257/E23.128, E21.499; 438/106, 111–113, 438/118, 123, 124, 127
See application file for complete search history.

(56) References Cited

U.S. PATENT DOCUMENTS

| | | | | |
|---|---|---|---|---|
| 6,348,726 B1* | 2/2002 | Bayan et al. | ................... | 257/666 |
| 7,060,535 B1* | 6/2006 | Sirinorakul et al. | .......... | 438/123 |
| 7,741,149 B2* | 6/2010 | Qiao et al. | ..................... | 438/106 |
| 2001/0008305 A1* | 7/2001 | McLellan et al. | ............. | 257/692 |
| 2004/0011699 A1* | 1/2004 | Park | .............................. | 206/710 |
| 2005/0017330 A1* | 1/2005 | Diot et al. | ...................... | 257/666 |
| 2005/0287710 A1* | 12/2005 | Huang et al. | ................... | 438/123 |
| 2007/0059863 A1* | 3/2007 | Li et al. | .......................... | 438/113 |

* cited by examiner

*Primary Examiner* — Meiya Li
(74) *Attorney, Agent, or Firm* — Jianq Chyun IP Office

(57) ABSTRACT

A method of fabricating a chip package is provided. A thin metal plate having a first protrusion part, a second protrusion part and a plurality of third protrusion parts are provided. A chip is disposed on the thin metal plate, and a plurality of bonding wires for electrically connecting the chip to the second protrusion part and the second protrusion part to the third protrusion parts is formed. An upper encapsulant and a lower encapsulant are formed on the upper surface and the lower surface of the thin metal plate respectively. The lower encapsulant has a plurality of recesses for exposing a portion of the thin metal plate at locations where the first protrusion part, the second protrusion part and the third protrusion parts are connected to one another. Finally, the thin metal plate is etched by using the lower encapsulant as an etching mask.

3 Claims, 4 Drawing Sheets

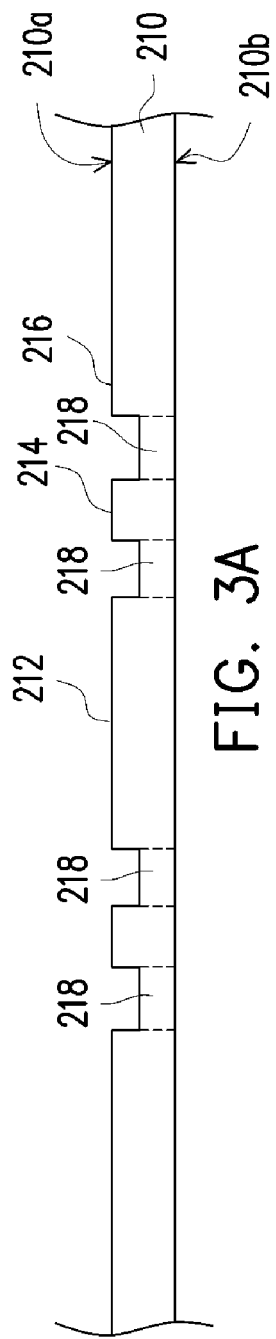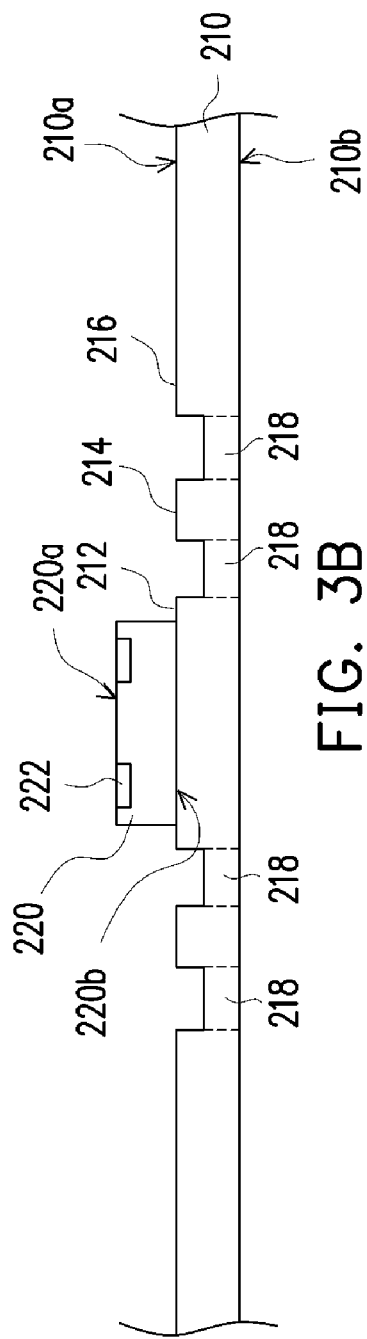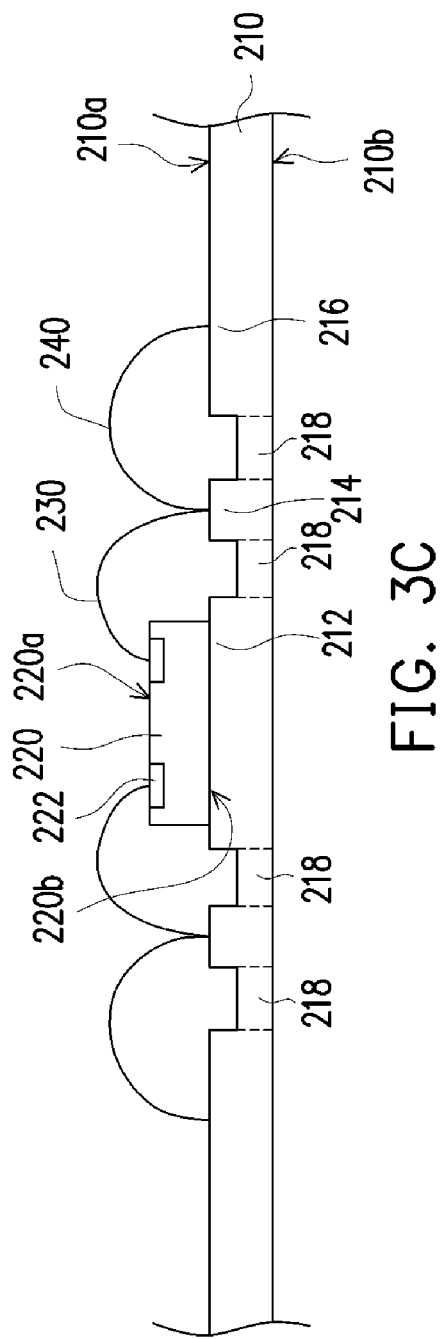

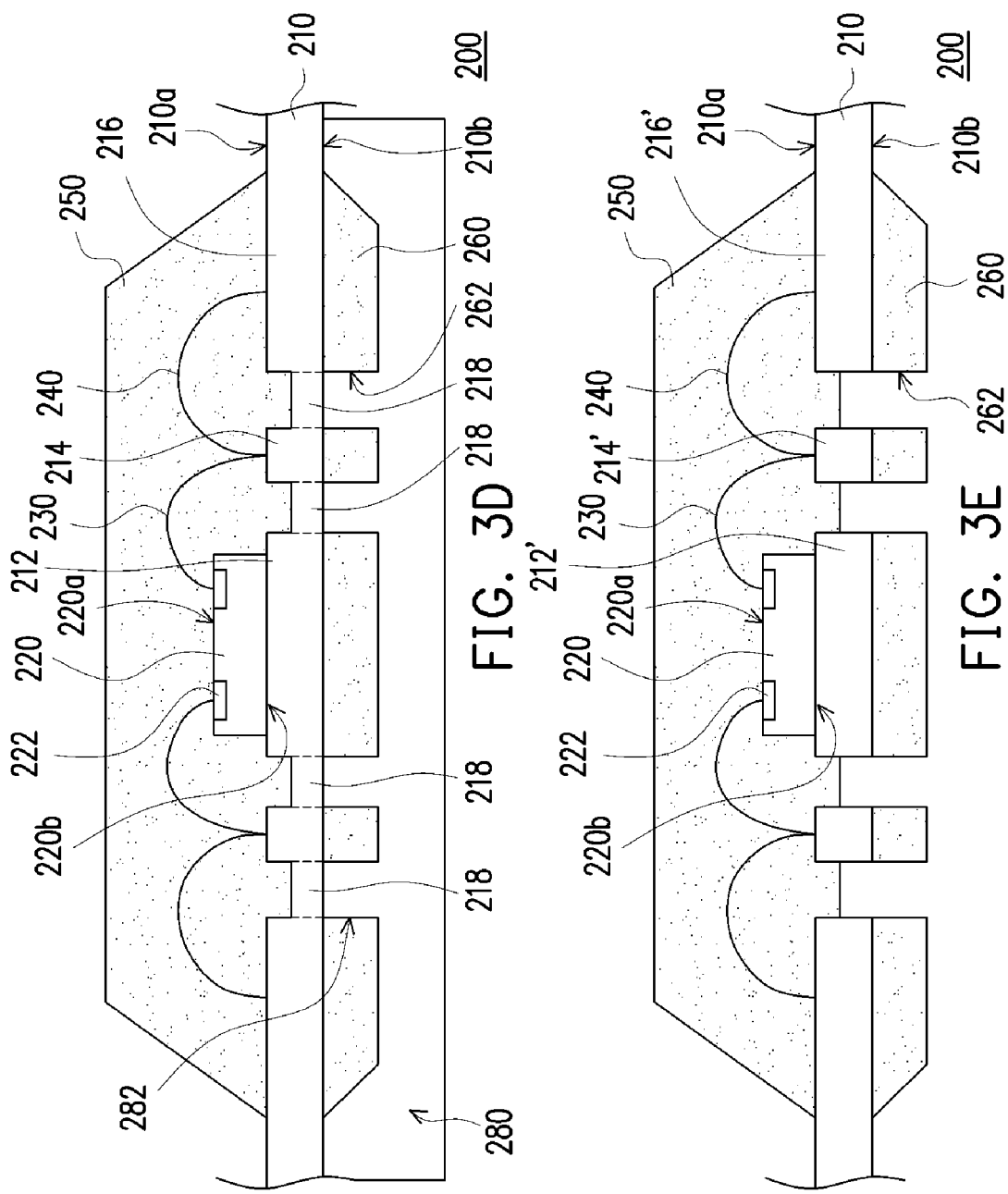

METHOD OF FABRICATING CHIP PACKAGE

CROSS-REFERENCE TO RELATED APPLICATION

This application is a divisional of and claims the priority benefit of U.S. application Ser. No. 11/737,766, filed on Apr. 20, 2007, now pending, which claims the priority benefit of Chinese application serial no. 200710087671.6, filed on Mar. 13, 2007. The entirety of the above-mentioned patent application is hereby incorporated by reference herein and made a part of this specification.

BACKGROUND OF THE INVENTION

1. Field of the Invention

The present invention generally relates to a method of fabricating a chip package, in particular, to a method of fabricating a chip package with a lead frame.

2. Description of Related Art

In the semiconductor industry, the fabrication of integrated circuits (IC) can be divided into three major stages: IC design stage, IC process stage and IC package stage.

In the fabrication of IC, the steps of producing a chip include at least wafer fabrication, IC formation and wafer sawing. The wafer has an active surface, in which active elements are formed. After the fabrication of IC in the wafer is completed, a plurality of bonding pads is disposed on the active surface of the wafer so that the chip subsequently cut out from the wafer can be electrically connected to a carrier through the bonding pads. The carrier is a lead frame or a package substrate, for example. The chip can be connected to the carrier by wire bonding or flip-chip bonding so that the bonding pads of the chip can be electrically connected to the contacts of the carrier to form a chip package.

FIG. 1 is a top view of a conventional chip package. FIG. 2 is a schematic cross-sectional view of the chip package in FIG. 1. As shown in FIGS. 1 and 2, the encapsulant 140 of the package is transparent and the profile of the encapsulant 140 is drawn using dash lines to facilitate subsequent description. The chip package 100 includes a lead frame 110, a chip 120, a plurality of first bonding wires 130, a plurality of second bonding wires 132, a plurality of third bonding wires 134 and an encapsulant 140. The lead frame 110 includes a die pad 112, a plurality of inner leads 114 and a plurality of bus bars 116. The inner leads 114 are disposed outside the die pad 112. The bus bars 116 are disposed between the die pad 112 and the inner leads 114.

The chip 120 has an active surface 122 and a back surface 124 on the opposite side. The chip 120 is disposed on the die pad 112 such that the back surface 124 faces the die pad 112. Furthermore, the chip 120 has a plurality of grounded contacts 126 and a plurality of non-grounded contacts 128. The non-grounded contacts 128 include a plurality of power contacts and a plurality of signal contacts. Both the grounded contacts 126 and the non-grounded contacts 128 are disposed on the active surface 122.

The first bonding wires 130 electrically connect the grounded contacts 126 to the bus bars 116. The second bonding wires 132 electrically connect the bus bars 116 to the grounded leads of the inner leads 114. The third bonding wires 134 electrically connect the other inner leads 114 to corresponding second contacts 128. The encapsulant 140 encapsulates the die pad 112, the inner leads 114, the bus bars 116, the chip 120, the first bonding wires 130, the second bonding wires 132 and the third bonding wires 134.

It should be noted that the process of forming a conventional chip package 100 requires the use of a patterned lead frame. Therefore, the lead frame 110 must include a die pad 112, a plurality of inner leads 114 and a plurality of bus bars 116. Because expensive exposure and development masks are required to pattern the lead frame, the cost for fabricating the lead frame is increased.

SUMMARY OF THE INVENTION

Accordingly, the present invention is directed to a chip package and a method of fabricating the same for resolving the problem of high cost when a patterned lead frame is directly used. The present invention uses a thin metal plate and utilizes etching techniques to form the die pad, the bus bars and the leads of a lead frame on the thin metal plate. As a result, the fabrication cost of the chip package is reduced.

Furthermore, the etching process of the present invention is performed using a lower encapsulant with recesses therein as an etching mask instead of using a conventional photomask used for exposure and development. Therefore, the cost of fabricating the photomask is saved and hence the cost of fabricating the chip package is reduced.

According to an embodiment of the present invention, a method of fabricating a chip package is provided. First, a thin metal plate is provided. The thin metal plate has an upper surface and a lower surface. The upper surface of the thin metal plate has a first protrusion part, a second protrusion part and a plurality of third protrusion parts. The second protrusion part is located between the first protrusion part and the third protrusion parts. Furthermore, the first protrusion part, the second protrusion part and the third protrusion parts are connected to one another. Next, a chip is provided. The chip has an active surface, a back surface and a plurality of chip bonding pads. The chip bonding pads are disposed on the active surface of the chip. After that, the back surface of the chip is fixed on the first protrusion part. Next, a plurality of first bonding wires and a plurality of second bonding wires are formed. The first bonding wires electrically connect the chip bonding pads to the second protrusion part respectively. The second bonding wires electrically connect the second protrusion part to the third protrusion parts respectively. Thereafter, an upper encapsulant and a lower encapsulant are formed. The upper encapsulant encapsulates the upper surface of the thin metal plate, the chip, the first bonding wires and the second bonding wires. The lower encapsulant encapsulates the lower surface of the thin metal plate but exposes the locations where the first protrusion part, the second protrusion part and the third protrusion parts are connected to one another. Finally, the thin metal plate is etched using the lower encapsulant as an etching mask until the first protrusion part, the second protrusion part and the third protrusion parts are electrically insulated from one another. Consequently, the first protrusion part forms a die pad, the second protrusion part forms a bus bar and the third protrusion parts form a plurality of leads.

In an embodiment of the present invention, the thin metal plate is a copper foil.

In an embodiment of the present invention, the first bonding wires and the second bonding wires are formed by using a wire-bonding technique.

In an embodiment of the present invention, the lower encapsulant includes a plurality of recesses that exposes the locations where the first protrusion part, the second protrusion part and the third protrusion parts are connected to one another.

In an embodiment of the present invention, the method of fabricating the chip package further includes forming a plurality of encapsulant inside the recesses of the lower encapsulant.

The present invention also provides a chip package. The chip package mainly includes a chip, a lead frame, a plurality of first bonding wires, a plurality of second bonding wires, an upper encapsulant, a first lower encapsulant, and a second lower encapsulant. The chip has an active surface, a back surface and a plurality of chip bonding pads. The chip bonding pads are disposed on the active surface. The lead frame has an upper surface and a corresponding lower surface. The lead frame includes a die pad, a plurality of leads and at least one bus bar. The back surface of the chip is fixed on the die pad. The leads surround the die pad. The bus bar is located between the die pad and the leads. The first bonding wires electrically connect the chip bonding pads to the bus bar respectively. The second bonding wires electrically connect the bus bar to the leads respectively. The first lower encapsulant encapsulates the lower surface of the lead frame and has a plurality of recesses for exposing the upper encapsulant between the die pad and the bus bar, the upper encapsulant between the bus bar and the leads, and the upper encapsulant between two adjacent leads.

In an embodiment of the present invention, the chip package further includes a plurality of second lower encapsulant formed inside the recesses of the first lower encapsulant.

The method of fabricating a chip package disclosed in the present invention includes disposing the chip on the thin metal plate and forming the required bonding wires for connecting the chip and the thin metal plate and the encapsulant. Finally, part of the thin metal plate is etched away to form the die pad, the bus bar and the inner leads of a lead frame.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A to 3F are schematic cross-sectional views illustrating the process for fabricating a chip package according to an embodiment of the present invention.

DESCRIPTION OF EMBODIMENTS

Figure 1:
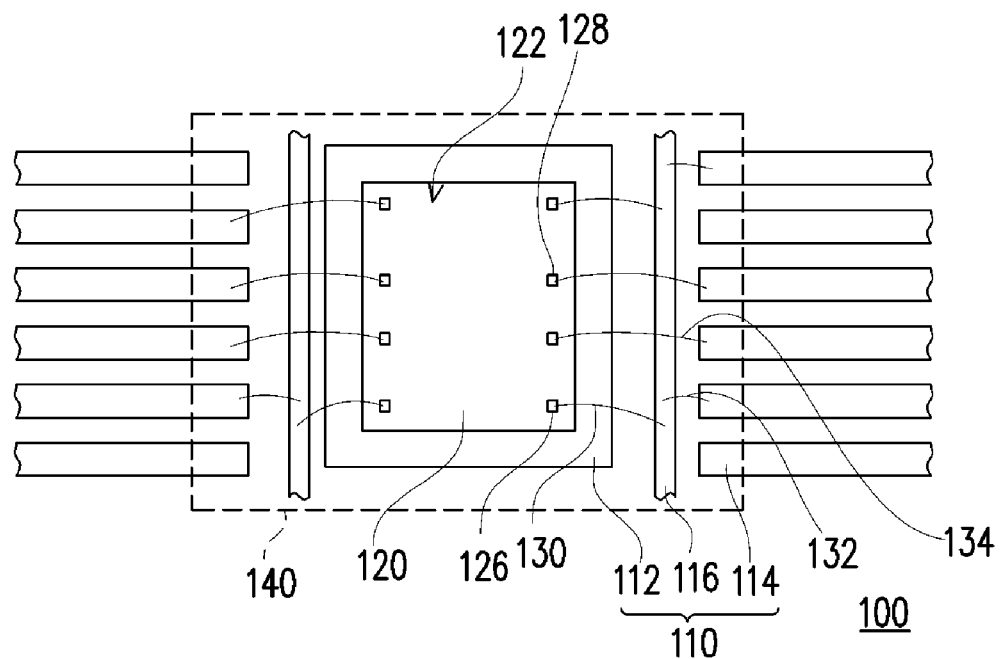
FIG. 1 is a top view of a conventional chip package.
Figure 2:
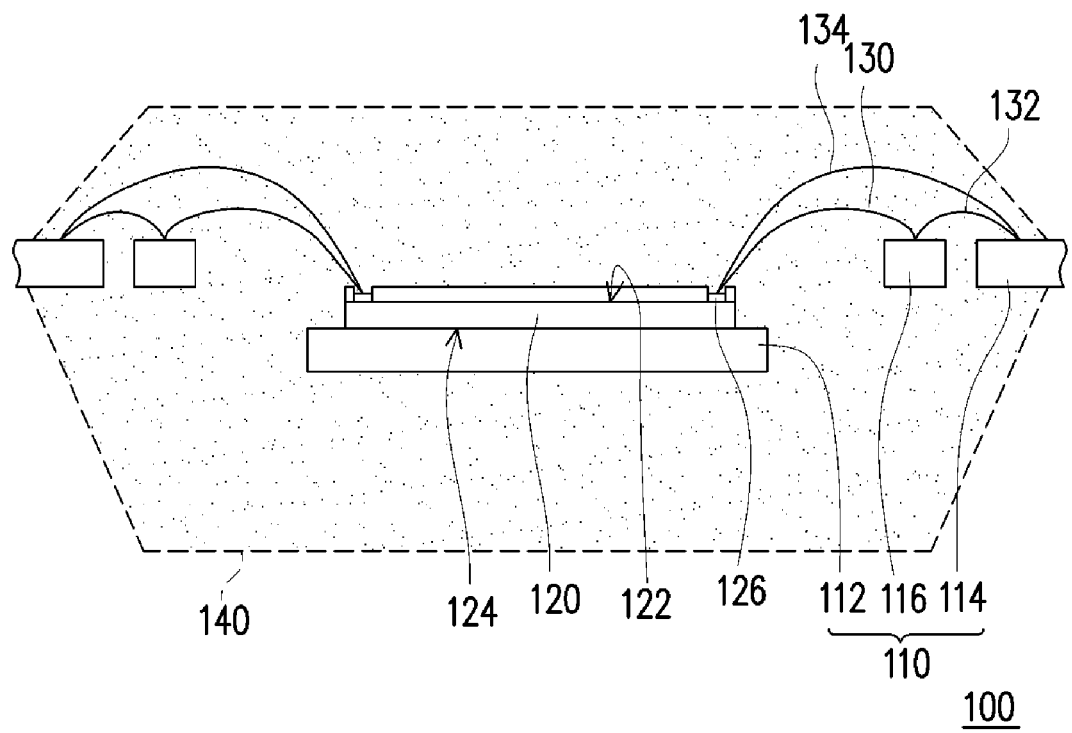
FIG. 2 is a schematic cross-sectional view of the chip package in FIG. 1.

Reference will now be made in detail to the present embodiments of the invention, examples of which are illustrated in the accompanying drawings. Wherever possible, the same reference numbers are used in the drawings and the description to refer to the same or like parts.

Figure 3F:
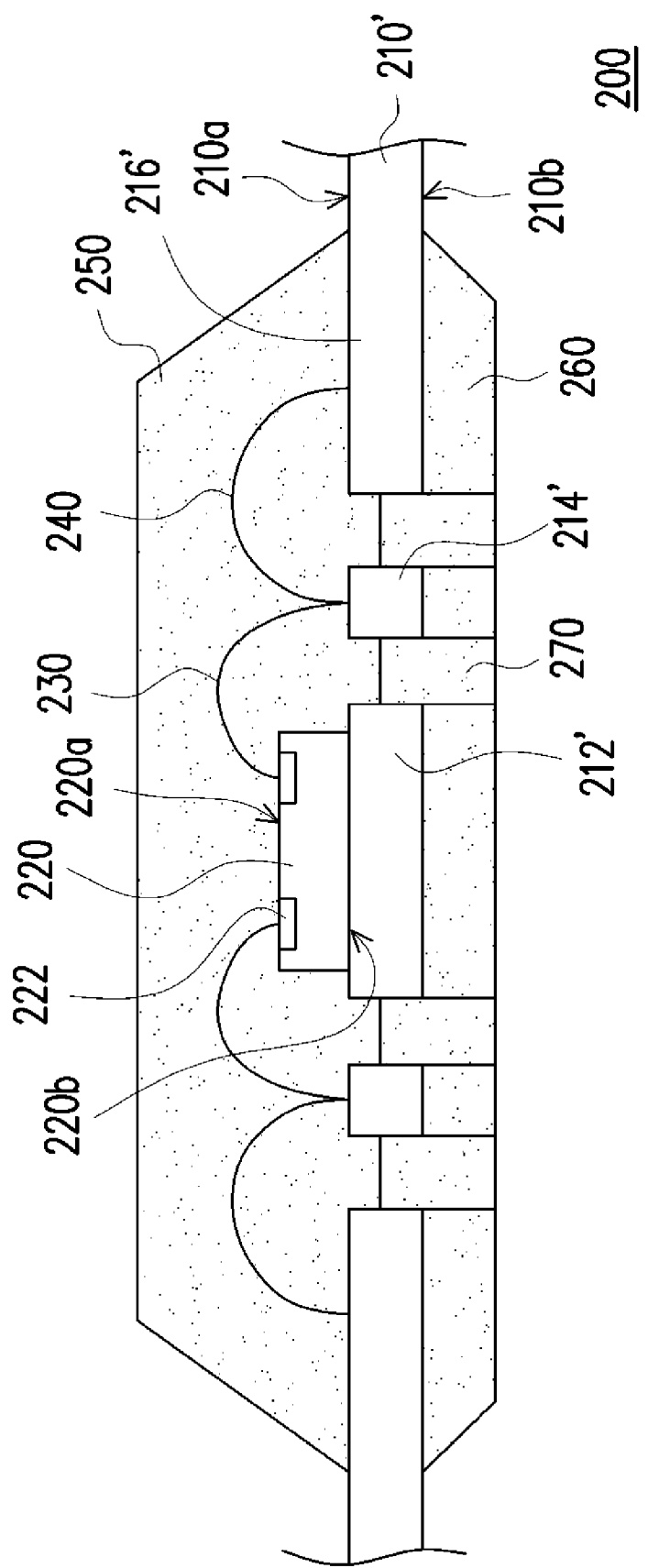

FIGS. 3A to 3F are schematic cross-sectional views illustrating the process for fabricating a chip package according to an embodiment of the present invention. First, as shown in FIG. 3A, a thin metal plate 210 is provided. The thin metal plate 210 has an upper surface 210$a$ and a lower surface 210$b$. The upper surface 210$a$ has a plurality of trenches so as to divide the thin metal plate 210 into a first protrusion part 212, a second protrusion part 214 and a plurality of third protrusion parts 216. Furthermore, the first protrusion part 212, the second protrusion part 214 and the third protrusion parts 216 are connected to one another. The first protrusion part 212 is substantially located in the central portion of the thin metal plate 210, and the second protrusion part 214 surrounds the outer sides of the first protrusion part 212. The third protrusion parts 216 surround the outer sides of the second protrusion part. In addition, the first protrusion part 212, the second protrusion part 214 and the third protrusion parts 216 are shaped like the die pad, the bus bar and the leads respectively. Therefore, the first protrusion part 212, the second protrusion part 214 and the third protrusion parts 216 can serve as the die pad, the bus bar and the leads of a lead frame after subsequent processing.

Next, as shown in FIG. 3B, a chip 220 is provided. The chip 220 has an active surface 220$a$, a back surface 220$b$ and a plurality of chip bonding pads 222. The active surface 220$a$ is on the opposite side of the back surface 220$b$. Furthermore, the chip bonding pads 222 are disposed on the active surface 220$a$ of the chip 220. The back surface 220$b$ of the chip 220 is fixed on the first protrusion part 212 of the thin metal plate 210. For example, the chip 220 is fixed on the first protrusion part 212 using adhesive glue.

As shown in FIG. 3C, a plurality of first bonding wires 230 and a plurality of second bonding wires 240 are formed. The first bonding wires 230 electrically connect the chip bonding pads 222 to the second protrusion part 214 respectively. The second bonding wires electrically connect the second protrusion part 214 to the third protrusion parts 216 respectively. The first bonding wires 230 and the second bonding wires 240 are formed by using a wire-bonding technique.

As shown in FIG. 3D, an upper encapsulant 250 and a lower encapsulant 260 are formed on the upper surface 210$a$ and the lower surface 210$b$ of the thin metal plate 210 respectively. The upper encapsulant 250 encapsulates a portion of the upper surface 210$a$ of the thin metal plate 210, the chip 220, the first bonding wires 230 and the second bonding wires 240. The lower encapsulant 260 encapsulates the lower surface 210$b$ of the thin metal plate 210. Furthermore, the lower encapsulant 260 has a plurality of recesses 262 that exposes the thin metal plate 210 at portions 218 of the thin metal plate 210 where the first protrusion part 212, the second protrusion part 214 and the third protrusion parts 216 are connected to one another. The recesses 262 of the lower encapsulant 260 are formed using the corresponding protrusion parts 282 of a mold 280 when the lower encapsulant 260 is formed.

Finally, as shown in FIG. 3E, the lower surface 210$b$ of the thin metal plate 210 is etched by using the lower encapsulant 260 as an etching mask until the first protrusion part 212, the second protrusion part 214 and the third protrusion parts 216 are electrically insulated from one another. Thus, the first protrusion part 212 can serve as a die pad 212' of a lead frame 210', the second protrusion part 214 can serve as a bus bar 214' and the third protrusion parts 216 can serve as leads 216'. Up to this stage, the process for fabricating the chip package 200 is almost completed.

To prevent the die pad 212', the bus bar 214' and the leads 216' as shown in FIG. 3E from oxidizing in air, the step as shown in FIG. 3F may be performed. As 20 shown in FIG. 3F, a plurality of encapsulant 270 is formed inside the recesses 262 of the lower encapsulant 260 to prevent the die pad 212', the bus bar 214' and leads 216' shown in FIG. 3E from exposing to air and causing their oxidation.

In summary, the present invention provides an innovative method of fabricating a chip package. First, a thin metal plate having a first protrusion part, a second protrusion part and a plurality of third protrusion parts is provided. Thereafter, a chip is disposed on the thin metal plate and then a plurality of bonding wires for electrically connecting a chip to the second protrusion part and the second protrusion part to the third protrusion parts is formed. Next, an upper encapsulant and a lower encapsulant are formed on the upper and lower surfaces of the thin metal plate. The lower encapsulant has a plurality of recesses that exposes the locations where the first, the second and the third protrusion parts are connected to one another. Finally, the thin metal plate is etched using the lower encapsulant as an etching mask so that the first protrusion part, the second protrusion part and the third protrusion parts form the die pad, the bus bar and the leads of a lead frame respectively.

The method of fabricating the chip package disclosed in the present invention differs from the conventional method of using a lead frame to serve as a carrier in that the conventional chip packaging process directly uses an existing patterned lead frame to package the chip. The chip in the chip package of the present invention, however, is first disposed on the thin metal plate and then the required bonding wires and encapsulant are formed. Finally, a portion of the thin metal plate is etched to form the die pad, the bus bar and the inner leads of the lead frame. Because the method of fabricating the chip package of the present invention uses a thin metal plate and relies on an etching the thin metal plate to form the die pad, the bus bar and the leads of a lead frame, fabrication cost of the chip package is reduced. Hence, the problem of the high cost of fabricating a chip package by directly using a patterned lead frame in the conventional method is resolved.

In addition, the lower encapsulant with recesses is used as an etching mask in the etching process of the present invention so that the lower encapsulant replaces the conventional photomask for performing the exposure and development process. Hence, the cost for fabricating the photomask is saved and overall fabrication cost of the chip package is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a chip package, comprising:
    providing a thin metal plate having an upper surface and a lower surface, wherein the upper surface of the thin metal plate has a first protrusion part, a second protrusion part and a third protrusion part, a first recess part, and a second recess part, wherein the second protrusion part is located between the first protrusion part and the third protrusion part, and the second protrusion part is directly connected to the first protrusion part by the first recess part and to the third protrusion part by the second recess part;
    providing a chip having an active surface, a back surface and a plurality of chip bonding pads, wherein the chip bonding pads are disposed on the active surface;
    fixing the back surface of the chip on the first protrusion part;
    forming a plurality of first bonding wires and a plurality of second bonding wires, wherein the first bonding wires electrically connect the chip bonding pads to the second protrusion part respectively, and the second bonding wires electrically connect the second protrusion part to the third protrusion parts respectively;
    forming an upper encapsulant and a lower encapsulant, wherein the upper encapsulant encapsulates the upper surface of the thin metal plate, the chip, the first bonding wires and the second bonding wires, the lower encapsulant encapsulates first portions of the lower surface of the thin metal plate opposite to the first protrusion part, the second protrusion part and the third protrusion part of the upper surface of the thin metal plate, and the lower encapsulant comprises a plurality of recesses to expose second portions of the lower surface of the thin metal plate opposite to the first recess part and the second recess part of the upper surface;
    etching the first recess part and the second recess part of the upper surface of the thin metal plate by using the lower encapsulant as an etching mask until the first protrusion part, the second protrusion part and the third protrusion part are electrically insulated from one another, so that the first protrusion part forms a die pad, the second protrusion part forms a bus bar, and the third protrusion part forms a lead; and
    forming a plurality of first encapsulant inside the recesses of the lower encapsulant after the first recess part and the second recess part of the upper surface of the thin metal plate are removed, wherein each bottom surface of the plurality of first encapsulant is coplanar with a bottom surface of the lower encapsulant.

2. The method according to claim 1, wherein the thin metal plate comprises a copper foil.

3. The method according to claim 1, wherein the first bonding wires and the second bonding wires are formed by a wire-bonding technique.

* * * * *